US009224456B2

(12) United States Patent
Cometti et al.

(10) Patent No.: US 9,224,456 B2
(45) Date of Patent: Dec. 29, 2015

(54) SETTING OPERATING PARAMETERS FOR MEMORY CELLS BASED ON WORDLINE ADDRESS AND CYCLE INFORMATION

(71) Applicant: STEC, Inc., Santa Ana, CA (US)

(72) Inventors: Aldo G. Cometti, San Diego, CA (US); Pablo Alejandro Ziperovich, San Diego, CA (US)

(73) Assignee: HGST Technologies Santa Ana, Inc., Santa Ana, CA (US)

( * ) Notice: Subject to any disclaimer, the term of this patent is extended or adjusted under 35 U.S.C. 154(b) by 0 days.

(21) Appl. No.: 14/724,773

(22) Filed: May 28, 2015

(65) Prior Publication Data

US 2015/0262659 A1    Sep. 17, 2015

Related U.S. Application Data

(63) Continuation of application No. 13/775,070, filed on Feb. 22, 2013, now Pat. No. 9,047,955, which is a continuation-in-part of application No. 13/076,340, filed on Mar. 30, 2011, now Pat. No. 8,737,136.

(60) Provisional application No. 61/602,552, filed on Feb. 23, 2012.

(51) Int. Cl.
*G11C 16/04* (2006.01)
*G11C 11/56* (2006.01)
*G11C 16/06* (2006.01)

(52) U.S. Cl.
CPC ........ *G11C 11/5635* (2013.01); *G11C 11/5642* (2013.01); *G11C 16/04* (2013.01); *G11C 16/06* (2013.01)

(58) Field of Classification Search
CPC ............... G11C 16/0483; G11C 16/10; G11C 16/3418; G11C 16/26; H01L 27/115
USPC .................. 365/185.17, 185.29, 218, 185.11, 365/230.03
See application file for complete search history.

(56) References Cited

U.S. PATENT DOCUMENTS

| 5,729,489 | A  | 3/1998  | Fazio et al. |
| 6,396,742 | B1 | 5/2002  | Korsh et al. |
| 6,429,785 | B1 | 8/2002  | Griffin et al. |
| 6,519,184 | B2 | 2/2003  | Tanaka et al. |
| 6,643,177 | B1 | 11/2003 | Le et al. |
| 6,675,071 | B1 | 1/2004  | Griffin, Jr. et al. |

(Continued)

OTHER PUBLICATIONS

Zhou, et al., "Error-correcting schemes with dynamic thresholds in nonvolatile memories," Information Theory Proceedings (ISIT), 2011 IEEE International Symposium, Jul. 31-Aug. 5, 2011, pp. 2143-2147.

(Continued)

*Primary Examiner* — Jason Lappas
(74) *Attorney, Agent, or Firm* — McDermott Will & Emery LLP

(57) ABSTRACT

Disclosed is an apparatus and method for adjusting operating parameters in a storage device. A controller in a solid state drive monitors current operating conditions of the drive's flash memory, and when the flash memory has been subjected to a predetermined number of program/erase cycles one or more stored bias values are retrieved from a storage location based on the wordline(s) associated with a current memory operation. Parameters of the memory operation are then adjusted based on the retrieved bias values, and the memory operation is performed using the adjusted parameters.

20 Claims, 7 Drawing Sheets

(56) References Cited

U.S. PATENT DOCUMENTS

| | | | |
|---|---|---|---|
| 6,888,758 B1 | 5/2005 | Hemink et al. |
| 6,928,001 B2 | 8/2005 | Avni et al. |
| 6,937,521 B2 | 8/2005 | Avni et al. |
| 7,009,889 B2 | 3/2006 | Tran et al. |
| 7,054,199 B2 | 5/2006 | Lee et al. |
| 7,173,852 B2 | 2/2007 | Gorobets et al. |
| 7,453,311 B1 | 11/2008 | Hart et al. |
| 7,468,919 B2 | 12/2008 | Sekar et al. |
| 7,599,208 B2 | 10/2009 | Kang |
| 7,613,045 B2 | 11/2009 | Murin et al. |
| 7,656,707 B2 | 2/2010 | Kozlov |
| 7,812,389 B2 | 10/2010 | Tanaka et al. |
| 8,072,805 B2 | 12/2011 | Chou et al. |
| 8,086,225 B2 | 12/2011 | Lee |
| 8,315,092 B2 | 11/2012 | Strasser et al. |
| 8,482,993 B2 | 7/2013 | Strasser et al. |
| 8,644,099 B2 | 2/2014 | Cometti et al. |
| 8,737,136 B2 | 5/2014 | Cometti |
| 8,819,503 B2 | 8/2014 | Melik-Martirosian |
| 2002/0174394 A1 | 11/2002 | Ledford et al. |
| 2005/0125199 A1 | 6/2005 | Slaight |
| 2005/0144358 A1 | 6/2005 | Conley et al. |
| 2005/0248999 A1 | 11/2005 | Tamura et al. |
| 2006/0039196 A1 | 2/2006 | Gorobets et al. |
| 2006/0061795 A1 | 3/2006 | Walmsley |
| 2006/0244041 A1 | 11/2006 | Tanaka et al. |
| 2008/0068912 A1* | 3/2008 | Lee ............... 365/222 |
| 2008/0229164 A1 | 9/2008 | Tamura et al. |
| 2009/0104900 A1 | 4/2009 | Lee |
| 2009/0109756 A1 | 4/2009 | Aritome |
| 2009/0187785 A1 | 7/2009 | Gonzalez et al. |
| 2009/0259916 A1 | 10/2009 | Hsu et al. |
| 2009/0282189 A1 | 11/2009 | Best et al. |
| 2010/0008137 A1 | 1/2010 | Jang et al. |
| 2010/0110748 A1 | 5/2010 | Best |
| 2010/0118608 A1 | 5/2010 | Song et al. |
| 2010/0180073 A1 | 7/2010 | Weingarten et al. |
| 2010/0315873 A1 | 12/2010 | Lee |
| 2011/0055468 A1 | 3/2011 | Gonzalez et al. |
| 2011/0167305 A1 | 7/2011 | Haratsch et al. |
| 2011/0188291 A1 | 8/2011 | Chevallier et al. |
| 2011/0219203 A1 | 9/2011 | Nurminen et al. |
| 2012/0017138 A1 | 1/2012 | Erez et al. |
| 2012/0147660 A1 | 6/2012 | Chevallier et al. |
| 2012/0236641 A1 | 9/2012 | Hu |
| 2012/0239991 A1 | 9/2012 | Melik-Martirosian |
| 2012/0319585 A1 | 12/2012 | Shteynberg et al. |
| 2013/0007344 A1 | 1/2013 | Belgal et al. |
| 2013/0097362 A1 | 4/2013 | Tan et al. |

OTHER PUBLICATIONS

Cai, et al., "Flash Correct-and-Refresh: Retention-Aware Error Management for Increased Flash Memory Lifetime," Computer Design (ICCD), 2012 IEEE 30$^{th}$ International Conference, Sep. 20-Oct. 3, 2012, pp. 94-101.

Chen, et al., "Reliability analysis and improvement for multi-level non-volatile memories with soft information," Design Automation Conference (DAC), 2011, 48$^{th}$ ACM/EDAC/IEEE, Jun. 2011, pp. 753-758.

* cited by examiner

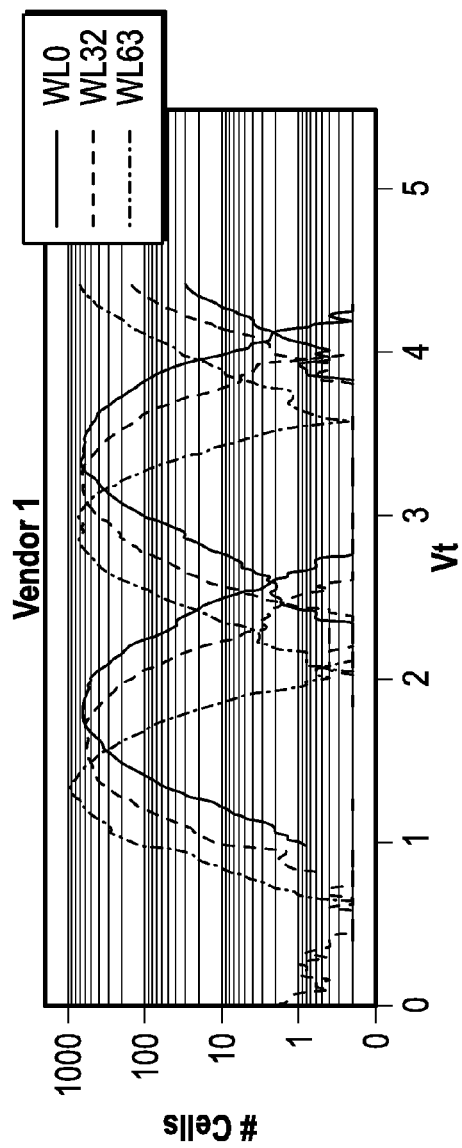
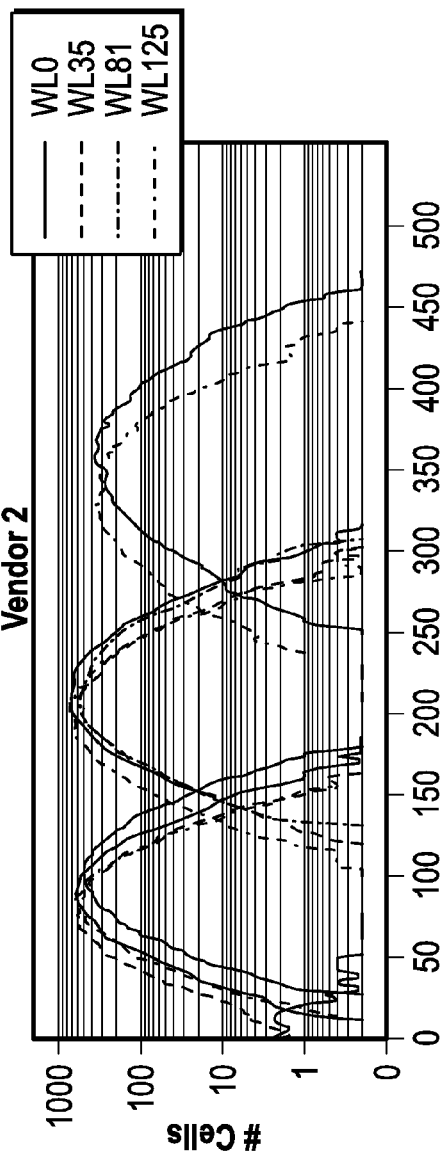
FIG. 3A
FIG. 3B

SETTING OPERATING PARAMETERS FOR MEMORY CELLS BASED ON WORDLINE ADDRESS AND CYCLE INFORMATION

CROSS-REFERENCES TO RELATED APPLICATIONS

The present application claims the benefit of priority under 35 U.S.C. §120 and is a continuation of U.S. patent application Ser. No. 13/775,070, entitled "Adjusting Operating Parameters for Memory Cells Based on Wordline Address and Cycle Information," filed on Feb. 22, 2013, which is a continuation-in-part of, and claims priority from, U.S. patent application Ser. No. 13/076,340, entitled "Apparatus and Method for Determining a Read Level of a Memory Cell Based on Cycle Information," filed on Mar. 30, 2011, now U.S. Pat. No. 8,737,136, issued May 27, 2014, which claims the benefit of U.S. Provisional Patent Application No. 61/602,552, entitled "Flash Memory Worldline Variation Compensation," filed on Feb. 23, 2012, the disclosures of which are hereby incorporated by reference in their entirety for all purposes.

TECHNICAL FIELD

The subject technology relates generally to memory devices and in particular multi-level cell flash memory devices.

BACKGROUND

Flash memory bears little resemblance to a magnetic recording system. Commodity flash chips are closed systems with no external access to analog signals, in sharp contrast to the typical Hard Disk Drive (HDD) where analog signals have always been available for detection. Even though the HDD is a complex electro-mechanical system and can suffer catastrophic failure, it has been possible to engineer drives to have a life expectancy with little to no degradation in performance, which extend beyond their time of technical obsolescence. The data reliability of flash memory, on the other hand, is known to degrade through the life cycle and therefore has a finite life. Consequently, when flash memory was first conceived as a memory device the target error rate at the output of the chip has been kept very low, as opposed to systems where stronger Error Correction Coding (ECC) may be used at the onset, like deep space communications.

Lower priced Solid State Drives (SSD) are typically manufactured using multi-level cell (MLC) flash memory for increased data capacity, but MLC has less data reliability than single-level cell (SLC) flash memory. Consumer SSD manufacturers have mitigated such problems by employing interleaving and/or providing excess capacity in conjunction with wear-leveling algorithms and/or limiting the amount of data the user can write to the device. MLC flash endurance, however, requires sophisticated algorithms to make them acceptable for enterprise SSD applications where mission-critical data is stored.

SUMMARY

The subject technology provides a method for setting operating parameters in a storage device. According to one or more implementations, a method comprises identifying, in connection with a memory operation, one or more wordlines associated with a plurality of flash memory cells, determining that a current memory cycle condition associated with the plurality of flash memory cells satisfies a predetermined cycle condition, setting one or more parameters of the memory operation based on one or more selected bias values, the bias values being selected based on the identified one or more wordlines and the current memory cycle condition satisfying the predetermined cycle condition, and performing the memory operation using the set one or more parameters. Other aspects include corresponding systems, apparatuses, and computer program products for implementation of the method.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

A detailed description will be made with reference to the accompanying drawings:

FIGS. 3A and 3B depict actual measured variations in threshold voltage distributions for different wordlines of an example memory block after 50,000 program/erase cycles. FIG. 3A depicts the variations after cycling, while FIG. 3B depicts the variations after cycling and bake.

DETAILED DESCRIPTION

Figure 1:
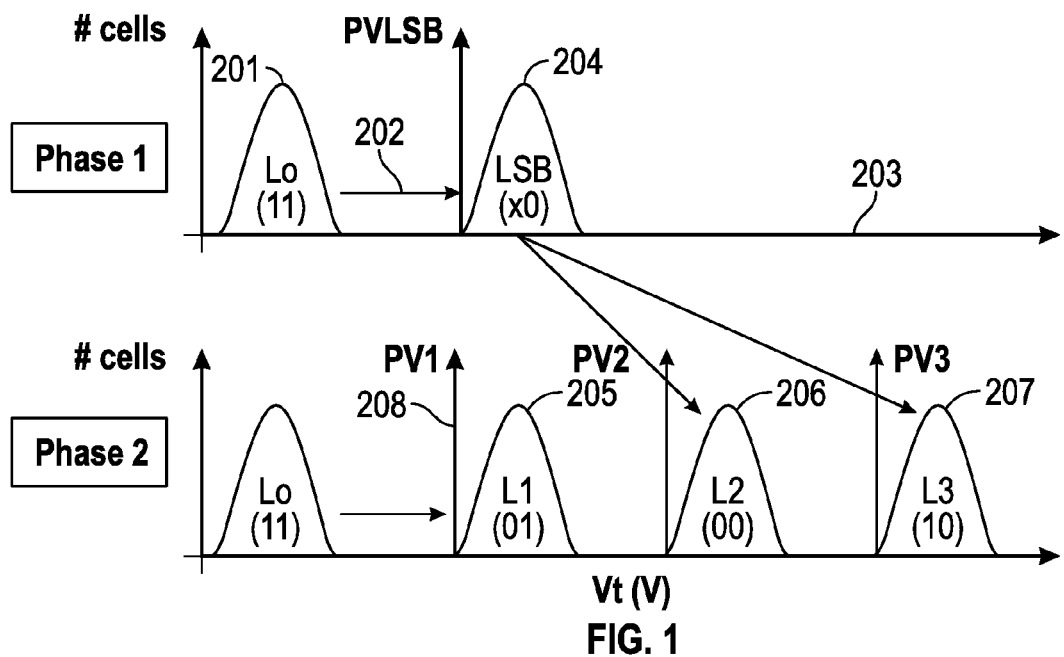
FIG. 1 is a diagram illustrating an example graph diagram of four possible cell threshold voltage ($V_T$) distributions and complimentary program verify levels for a group of memory cells in a multi-level cell flash memory storing two bits per cell.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology may be practiced without these specific details. In some instances, structures and components are shown in block diagram form in order to avoid obscuring the concepts of the subject technology. Like components are labeled with identical element numbers for ease of understanding.

In a flash memory device, for example, with NAND architecture, memory cells are grouped in strings, with each string consisting of a set of MOS transistors connected in series between a drain select transistor, connected to a bit line of the memory block, and a source select transistor, connected to a reference voltage distribution line. Each memory cell includes a floating-gate MOS transistor. When programming a memory cell, electrons are introduced into the floating-gate, by means of Fowler-Nordheim (F-N) Tunneling. The non-volatility of the cell is due to the electrons maintained within the floating-gate even when the device power supply is removed. Bits are stored by trapping charge on the floating gate (an electrically isolated conductor) which stores a logic value defined by its threshold voltage (read threshold) commensurate with the electric charge stored. When the cell is erased, the electrons in the floating gate are pulled off by quantum tunneling (a tunnel current) from the floating gate to, for example, the source and/or substrate.

As a flash memory is cycled (that is, programmed and erased repeatedly), its physical qualities change. For example, the repeated placement and removal of electrons on the floating gate during programming and erase operations, respectively, causes some excess electrons to be trapped in the device. Also, when one or multiple cells are programmed, adjacent cells may experience an unexpected and undesired charge injection to their floating gates, thus leading to corruption of data stored therein. For instance, electrons may leak into neighboring cells after prolonged stress due to the voltages at the gates of neighboring cells. The threshold voltages of these memory cells may eventually take values that are different (higher or lower) than expected values, causing errors when the data is read. Generally, the damage done becomes a function of the field strength (voltage) and duration; that is, programming the flash memory to high threshold voltage conditions increases the rate of damage arising from both program and erase processes because it requires longer duration and/or higher applied fields. For instance, adding enough electrons can change a cell from an erased state to a programmed state.

In certain implementations, memory cells are arranged in an array of columns (bitlines) and rows (wordlines). The address of a memory cell represents the intersection of a bitline and wordline corresponding to the memory cell. Flash memory may further be composed of blocks, with each block divided into pages. In MLC memory, every row of cells of flash composes 2 pages: a LSB and a MSB page. If a block has 128 pages then it has 64 rows of cells, with each row having two pages. Each row behaves differently because when cells are physically together in a die they are subject to variations in voltages and resistances and the like as part of the manufacturing process.

In NAND architecture, it has been found that the problem of degradation is especially problematic because each transistor in the string of the cells being read (e.g., at a bitline) receives an elevated voltage stress, even though only one cell of that string (e.g., at a location in the bitline corresponding to a designated wordline) may be read at any one time. Due to degradation, when programmed, the cells of some rows (wordlines) are further from their expected values (e.g., an expected voltage measured at a corresponding bitline) than others. It has been observed that these variations can be associated with individual wordlines. Accordingly, the subject technology characterizes these variations as a measurable value, and provides a mechanism to compensate for the variations at runtime. For example, if cell voltages in a wordline are found to shift (e.g., as a result of a characterization process) then a bias may be introduced during the program or subsequent read operation to correct the programmed voltage or read value. Accordingly, the non-linearity of actual programming values between cells in different wordlines is reduced, thereby reducing errors when reading the cells.

Read retry capability has been introduced to perform data re-read with shifted voltage thresholds when read errors exceed error correction capability, however, read performances are further degraded by the number of read retries performed, as the host has to wait the time for the subsequent reads to get the data. Endurance has been sacrificed to meet the requirements of mainstream consumer flash application which are low cost (maximum bits in each cell), long retention time (e.g., extended dwell time), fast programming/erase, and low error rate to work with unsophisticated data storage controllers. Contrary to industry practice, the subject technology reduces the need for read retry capability by providing, at runtime, memory cell bias information to memory operations based on the location of the wordline and estimated cycle age of the memory cell, thereby improving the reliability and endurance of the overall flash memory cell architecture, making the flash memory suitable for enterprise applications.

FIG. 1 is a diagram illustrating an example graph diagram of four possible cell threshold voltage ($V_T$) distributions and complimentary program verify levels for a group of memory cells in a multi-level cell flash memory storing two bits per cell, according to one aspect of the subject technology. The illustration shows the $V_T$ distributions for flash with low cycles ("fresh"), distributions for word-out flash ("cycled"), and distributions for cycled flash which has gone through high temperature exposure ("baked"). MLC NAND flash memory provides for more than one bit per cell by choosing between multiple levels of electrical charge (read level) to apply to the floating gates of its cells to achieve multiple states of conductivity, each occurring at a different voltage threshold $V_T$. As depicted in FIG. 1, a MLC NAND cell is capable of storing four states (levels of charge) per cell, yielding two logical bits of information per cell: the Most Significant Bit (MSB) and Least Significant Bit (LSB). These two bits may make up corresponding MSB and LSB pages of a memory block.

In some aspects, a NAND memory block is programmed one page at a time using an Incremental Step Programming Procedure (ISSP) and erased using a similar Incremental Step Erase Procedure (ISEP). In some aspects, the ISPP and/or ISEP may be performed by an internal flash controller (e.g., within a flash memory) in response to one or more commands received from a data storage controller (e.g., a memory controller). For example, the memory cells that are to be programmed may be selected at the bit line. A "page operation" may be performed to apply a voltage at the gates of each cell in the memory page. A corresponding selection at the bit lines creates a voltage potential in the selected group of memory cells where the LSB is selected to be different (e.g., binary 10 or 00) than the erased L0 distribution state 201 (e.g., binary 11). Accordingly, ISPP increases 202 the threshold voltage $V_T$ 203 in the floating gates of the selected group of cells to create LSB distribution 204. Then, in a similar manner, during a MSB page program operation, ISPP is applied to create an L1 distribution 205 from the erased L0 distribution 201 (e.g., binary 01), or, an L2 distribution 206 (e.g., binary 00) or L3 distribution 207 (e.g., binary 10) from the previously programmed LSB distribution 204.

In some aspects, all of the above distributions are created from L0 distribution 201 by applying a series of ISPP voltage pulses to the memory cells of the page which is being programmed. In some aspects, the ISPP includes a series of voltage pulses that are applied in a step pattern with the amplitude of each pulse incrementally increased with increasing pulse number, starting from a certain starting magnitude. In some aspects, an internal flash controller of a flash memory may perform a programming verification (sensing) operation in between each step. Alternatively, this verification operation may be performed after a specific number of steps (the number of steps, for example, being stored on a storage medium). To verify a cell has been successfully programmed, the data storage controller applies a program verify voltage 208 in an attempt to conduct the cell. In some aspects, if the threshold voltage of a cell in the memory page is detected above a certain program verify level, the internal flash controller may stop further programming of that single cell by setting it to a program inhibit state.

In some aspects, LSB and MSB programming use different values of ISPP starting magnitude and/or ISPP step magnitude. Accordingly, a different ISPP step and/or starting magnitudes can be used during the MSB programming of L1 distribution 205 than in the programming of L2 distribution 206 and/or L3 distribution 207. This is because programming to a higher $V_T$ level requires the application of a higher voltage potential between the MOS metal gate and the substrate. In some aspects, parameter values for a program operation may be stored in a storage medium configured to be accessed by a data storage controller, and used to determine (e.g., calculate) further values and/or issue commands to the flash memory. The controller may be configured to communicate with the flash memory via registers (e.g., the test register) and/or an internal flash controller to provide commands for modifying certain parameters (e.g., nominal parameters set by the chip manufacturer) of the flash memory to vary the $V_T$ distributions at run-time and/or to vary the voltages applied to conduct the memory cells (read levels). As will be further described, these parameters can be dynamically determined and/or adjusted at run-time as a function of various circuit characteristics (e.g., program/erase cycle, retention time, BER, temperature) and/or in response to commands received from a host via a host interface.

Figure 2:
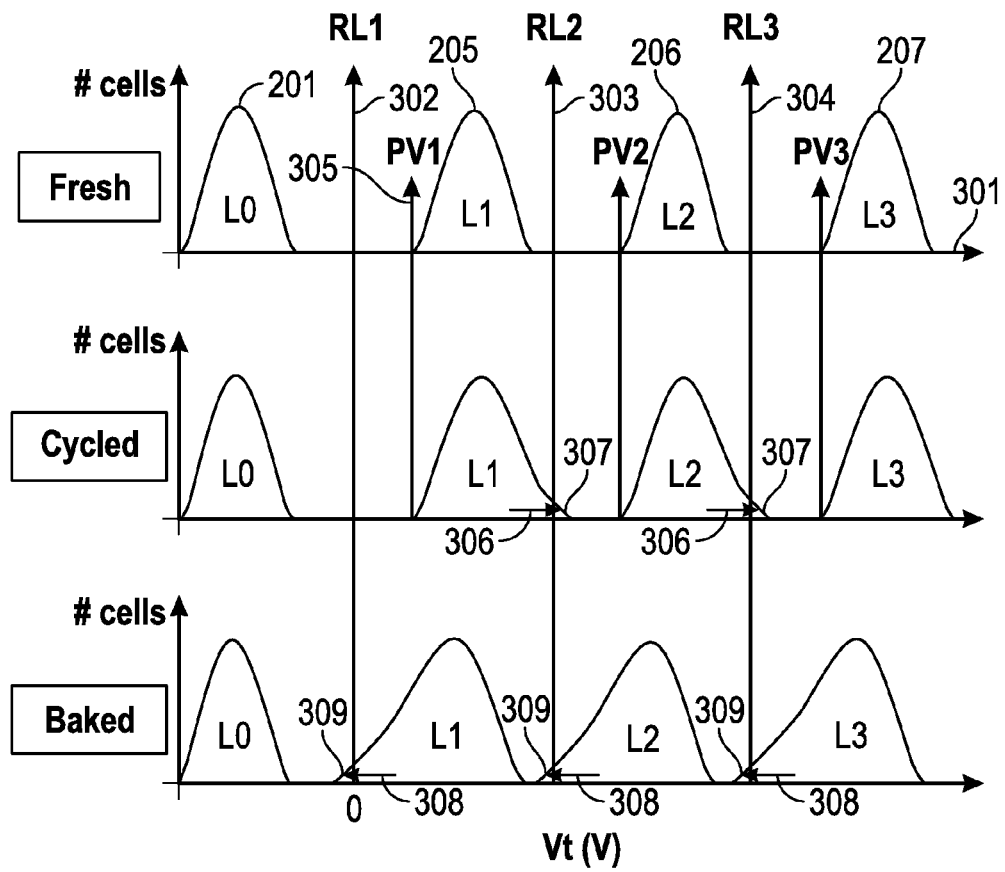
FIG. 2 is a graph diagram illustrating an example threshold voltage evolution of a 2-bit MLC NAND flash memory cell with read levels and program verify levels chosen a priori at beginning of life.

FIG. 2 is a graph diagram illustrating an example threshold voltage evolution of a 2-bit MLC NAND flash memory cell with read levels and program verify levels chosen a priori at beginning of life, according to one aspect of the subject technology. The topmost row represents the four possible distributions of each programming state in a group of memory cells at a memory cell's beginning of life (BOL). The respective programming distributions of L0 distribution 201, L1 distribution 205, L2 distribution 206, and L3 distribution 207 are shown along a voltage threshold continuum 301. The middle row of FIG. 2 depicts an exemplary progression of the programming distributions after repeated program/erase cycling. The buildup of electrons trapped on the floating gates of the memory cells has caused some cells to be programmed with higher voltage thresholds (increasing the standard deviation of the distribution at a higher $V_T$). This shift 306 in voltage thresholds may eventually cause the right edges of the $V_T$ distributions to reach the higher adjacent read levels. When the $V_T$ of some of the cells in the distributions begin to cross 307 the higher read levels, the likelihood that a read operation will produce an error increases. The bottom row depicts an exemplary result of an extended retention time (e.g., dwell time) on the memory cells. As the number of program/erase cycles increases, some of the memory cells lose electrons, causing their voltage thresholds to drop (increasing the standard deviation of the deviation at lower $V_T$). This $V_T$ drop is a function of both the amount of cycling and the temperature the cell has been subjected to. This shift 308 may eventually cause the left edges of the $V_T$ distributions to reach the lower adjacent read levels. The more cycles over which data is retained, and the higher the temperature, the more extreme the decline. If the read levels remain fixed, the $V_T$ distributions that have crossed 309 the next lower read level may cause significant errors.

With reference to the top row of FIG. 2, after ISPP, the edges of each of the distributions are suitably spaced from adjacent read levels. In some aspects, spacing can be altered by setting program verify voltages 305 (e.g., PV1, PV2, and/or PV3) during the verification operation sufficiently higher than a lower read level, but sufficiently low enough to prevent even those cells in the distribution having the highest $V_T$ (largest deviation) from crossing the next higher voltage corresponding to the read level. To ensure that all cells in a distribution will conduct, a read level voltage greater than the distribution is applied. In this regard, RL1 voltage 302 will cause cells in L0 distribution 201 to conduct, RL2 voltage 303 will cause cells in L1 distribution 205 to conduct, RL3 voltage 304 will cause cells in L2 distribution to conduct, and so on. Where, as depicted by FIG. 2, only four states are available, RL3 voltage 304 will not cause any cells in L3 distribution 207 to conduct. Generally, for N distributions there will be N-1 read levels. In the depicted example, there are four distributions (of states) and three read levels. Those skilled in the art will recognize that there may be eight, sixteen, or more distributions without departing from the scope of the subject technology.

FIG. 3A depicts observed variations in threshold voltage distributions for different wordlines in an example memory block after 50,000 program/erase cycles, for one particular flash supplier. FIG. 3B shows the same observation for another flash supplier. Flash memory threshold voltage distributions are seen to vary depending on the wordline address. Current flash operations may be performed with program verify and read level values independent from wordline address and produce an undesirable high number of bits in error where read level placement is not optimal. The subject technology, however, compensates for wordline misalignment by either modifying program verify levels at program time or modifying read levels at read time based on wordline address. These modifications may vary depending of the number of program/erase cycles experienced by the flash memory.

As will be described in further detail, an adjusted program verify level 305 may be generated based on cycle information and/or a wordline address of cells being programmed. For example, a data storage controller may monitor program/erase cycles and, for a program operation, adjust the program verify level based on a bias value corresponding to a predetermined number of cycles. In another example, the adjustment may be based on retention time (e.g., dwell time) after a certain number of cycles.

A storage system maintains one or more lookup tables (e.g., on a storage medium) for storing values pertaining to program verify levels 305. Additionally or in the alternative, the one or more lookup tables may store a program verify level bias adjustment to be applied to cells at designated wordline addresses so that cells in each wordline may be adjusted differently than other wordlines. The bias values may be indexed by wordline address (or page or block address) and memory cycle condition (e.g., a number or range of program/erase cycles, retention time, bit error rate (BER), or die temperature of a flash memory). The data storage controller may index the lookup table by the wordline address and cycle condition to retrieve a bias value for adjusting the program verify level. As the condition(s) related to a flash memory change over time, the data storage controller may index the lookup table to determine the correct bias value to use for the changed condition(s). The controller then verifies programming levels using the adjusted program verify level. In some aspects, the controller may apply the bias value to generate a program verify level and then provide the program verify level to the flash memory by setting values of registers (e.g., the test register), and/or by sending one or more commands to an internal flash controller of the flash memory. In other aspects, the controller may bias program verify level at beginning of life (BOL) to a higher value, for example, than the default value provided by the flash manufacturer, in anticipation of extended cycles or retention times. In further aspects, the controller may determine a lower program verify level to reduce BER (e.g., due to excessive cycling).

The controller may also be configured to adjust read levels (e.g., read level 303) to higher or lower values to reduce BER and extend the endurance of the flash memory. Similar to the procedure described previously with regard to program verify levels, read levels may also be based on dynamically changing memory cycle conditions. As the condition(s) related to the flash memory change over time, the controller may index one or more lookup tables to determine a bias for adjusting a read level according to the changed condition(s). As described previously with regard to program verify levels, the one or more lookup tables may store a single read level adjustment to be applied to cells in a specific wordline so that the wordline may be adjusted differently than other wordlines.

The previously described lookup tables (e.g., for program voltage levels and/or read levels) may be initially populated based on a characterization of the flash memory die (e.g., based on data collected from a simulation of the flash memory, or test data received from testing a memory die). The amount by which the read levels can be adjusted may vary depending on the memory chip specifications and/or other qualities set by the manufacturer and the subject technology is not limited to any particular value or values. For example, the flash memory may be cycled to a specific number of cycles (e.g., 20,000 program/erase cycles) and values for read levels and/or program verify levels for each distribution (e.g., L1, L2, and L3) compared to manufacturer values. Bias values may then be determined for each wordline address based on the comparison between the cycled value and manufacturer data.

Once the bias values are determined, they are stored in the one or more lookup tables to be indexed by wordline address and memory cycle condition (e.g., cycle count). The process may then be repeated to select values at successive cycle intervals (e.g., "BOL", "low cycles", "mid cycles", "EOL"). Accordingly, to improve bit error rate, a bias value as a function of wear (cycles) may be established for future application in a memory operation when the flash memory reaches a cycle count corresponding to a respective cycle interval.

To reduce the number of index entries, wordlines having similar bias values (e.g., adjacent wordlines) may be grouped together. A bias value for a group wordlines may be a value selected to be within a predetermined deviation of bias values determined (or observed) for each of the group of wordlines. The bias value may be a value determined for one of the wordlines in the group. In one example, WL0 through WL15 may share the same bias, WL16 through WL31 may share the same bias, and the like. These groups of bias values may be used in either programming or read operations.

A combination of read levels and program verify levels generating the lowest BER may be found for each wordline address at each adjustment period (number of cycles or length of retention time). In some aspects, the adjustment period (e.g., range of cycles) may be at least partially determined by a predetermined maximum acceptable BER. The maximum acceptable BER may be determined by a maximum number of bits correctable by ECC. The number of bit errors is proportional to the number of cell voltage "transitions" that occur when an edge of a $V_T$ distribution crosses an adjacent read level (e.g., FIG. 2, bottom row). In some aspects, the adjustment can be made to minimize transitions within the capability of ECC. In view of this disclosure, those skilled in the art will recognize how to simulate and/or test flash memory in order to select adjusted read levels and/or program verify levels (at each level of cell distribution) for placement in their respective one or more lookup tables.

Figure 4:
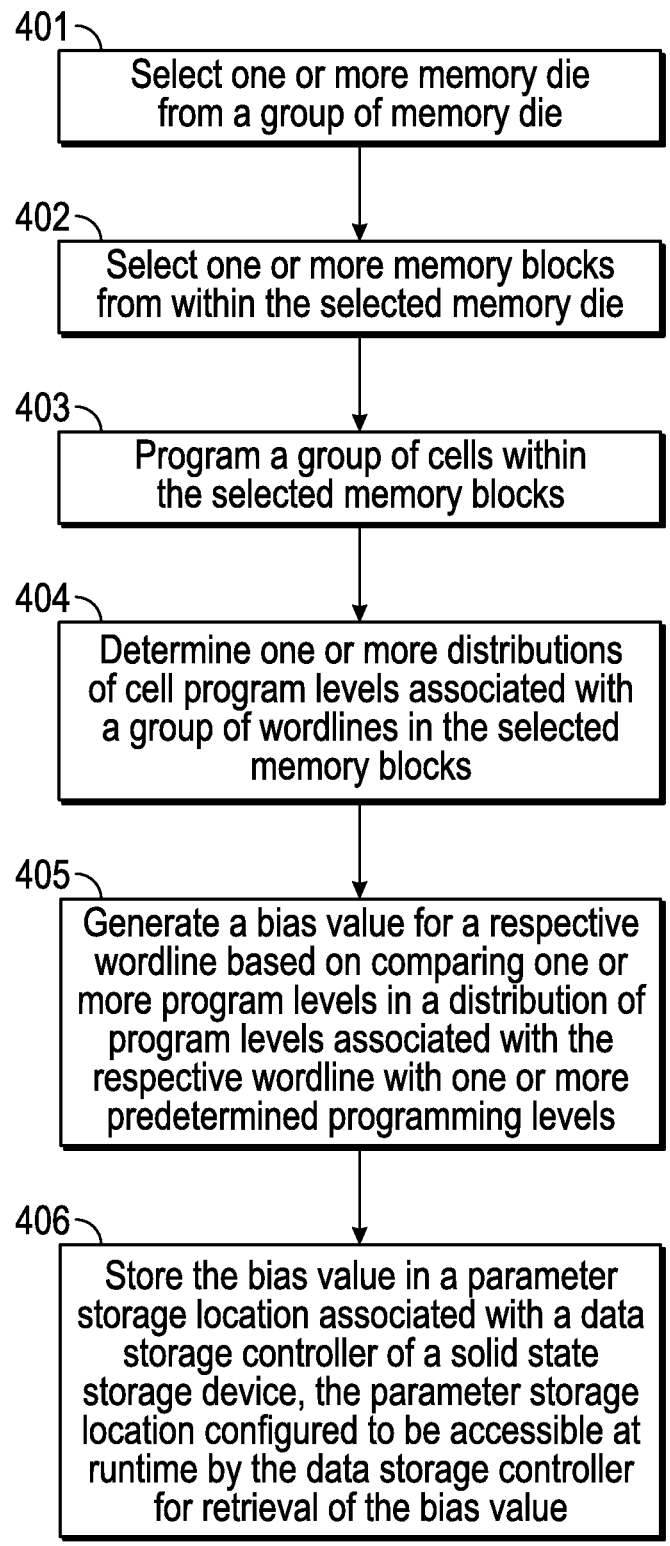
FIG. 4 is a flowchart illustrating an example process for offsetting operation variations in memory cells.

FIG. 4 is a flowchart illustrating an example process for offsetting operation variations in memory cells, according to one aspect of the subject technology. According to some aspects, one or more blocks of FIG. 4 may be executed by a computing system (including, e.g., a data storage controller of an SSD, processor, or the like). Similarly, a non-transitory machine-readable medium may include machine-executable instructions thereon that, when executed by a computer or machine, perform the blocks of FIG. 4. Accordingly, the blocks of FIG. 4 may be performed within the context of a manufacturing or engineering testing environment.

In block 401, one or more memory die are selected from a group of memory die. In some aspects, the group of memory die is associated with a common origin of manufacture. For example, the group of memory die may be selected from a lot associated with the same manufacturing date or manufacturing process. A designated lot of memory die may be received from a given manufacturer, and the one or more selected memory die are randomly selected from the lot. The one or more memory die may be manually selected, or automatically selected by a computing algorithm for selecting memory die.

In block 402, one or more memory blocks are selected from within the selected memory die. For the purpose of this disclosure a "memory block" may also be a "page" of memory, or other similarly situated memory cells organized as a group. The one or more memory blocks may be randomly selected by address, or manually selected by identifying one or more predetermined addresses.

In block 403, the system programs a group of cells within the selected memory blocks. In some aspects, the group of cells may be erased and reprogrammed for a predetermined number of times (e.g., 10,000 program/erase cycles). For example, a number of program/erase cycle intervals may be selected, each interval being separated by a number of program/erase cycles such that the intervals substantially span an expected lifetime of the solid state drive. If the expected cycle lifetime of the solid state drive is 100 k program/erase cycles then the selected intervals may be located at 1,000, 20,000, 40,000, 75,000, and 100,000 program/erase cycles. Other intervals may be selected. For example, each interval may be separated by a similar number of cycles, for example, each 10,000, 20,000, or 25,000 program/erase cycles.

The program/erase cycles may be performed on cells associated with a group of identical wordlines in the selected memory blocks over the number of program/erase cycle intervals. For example, the program/erase cycles may be performed on a select number of wordline addresses across the selected blocks and/or memory die. In this regard, cells at the identical memory addresses of each block in the group of selected blocks may be subjected to the same number of program/erase cycles.

In block 404, the system determines one or more distributions of cell program levels associated with a group of wordlines in the selected memory blocks. For example, a distribution may be associated with a wordline by being associated with an address of the wordline. Accordingly, a distribution may be for cells in the group of selected blocks at the same wordline address. Additionally or in the alternative, the distribution of the cells may be determined for each interval. For example, the program levels for cells in the distribution may be determined for cells at the same wordline address and/or bitline address across all of the selected blocks.

In block 405, a bias value for a respective wordline is generated based on comparing one or more program levels in a distribution of program levels associated with the respective wordline with one or more predetermined programming levels (e.g., determined from manufacturing data associated with a corresponding memory die). The bias value, when applied to a program (or read) operation, offsets a shift in program levels, and may restore the program levels to within a predetermine tolerance of a predetermined value for the cycle interval, the predetermined value based on the predetermined programming levels. The predetermined programming levels, for example, may contain expected values for cells at an address after a number of program/erase cycles based on previously conducted simulation results, or derived from specifications provided by the manufacturer of the corresponding memory die.

The bias value for a respective wordline may represent a shift in a minimum or maximum program level associated with a distribution of cell program levels associated with the wordline (e.g., at a wordline address) from an expected minimum or maximum cell program level based on the predetermined programming levels. Additionally or in the alternative, the bias value for a respective wordline may represent an average shift in a distribution of cell program levels associated with the wordline from expected cell program levels based on the predetermined programming levels.

In block 406, the bias value is stored in a parameter storage location (e.g., a lookup table) associated with a data storage controller of a solid state storage device, the parameter storage location configured to be accessible at runtime by the data storage controller for retrieval of the bias value. Accordingly, the parameter storage location may be configured to provide the bias value to the data storage controller during a memory operation based on a provided wordline address and a current program/erase interval. In this regard, multiple bias values may exist for different program/erase cycle intervals for a given memory address.

In some aspects, the memory operation may include a program operation or a read operation. The data storage controller may utilize one or more parameters during the memory operation depending on the type of operation. For example, where the memory operation is a read operation, the data storage controller may set a program read level (e.g., a voltage level placed at the bitline to activate the memory cell). Where the memory operation is a program operation the data storage controller may set a program verify level. Additionally or in the alternative, the program verify level may be set within the flash memory. For example, the data storage controller may be configured to program the flash memory (e.g., via one or more registers of the flash memory) with a program verify level to use for a certain range of memory cycle conditions (e.g., program/erase cycles), and/or adjust the program verify level of the flash memory on a current memory cycle condition satisfying a predetermined threshold (e.g., greater than a number of cycles, or within a new cycle range).

If the bias value represents a shift in program levels after a number of program/erase cycles, the bias value may be applied to either the verify level or read level to correct wordline misalignment over the lifetime of the memory. If the data storage controller is going to correct wordline misalignment at read time then the bias will be applied to adjust the read level in accordance with the interval corresponding to the current program/erase cycle. In this case, the bias may be added to a default read level used by the data storage controller and/or the flash memory device. If the data storage controller is going to correct wordline misalignment at program time then the bias may be applied to adjust the program verify level in accordance with the interval corresponding to the current program/erase cycle. In some aspects, a polarity of the bias value may be reversed before the bias value is stored. For example, program verify levels may require subtraction of the bias from a default value. To reduce overhead during the program operation, the bias value stored in the parameter storage location may be the negative of the shift determined in block 405.

Compensating for wordline misalignment at program time by modifying program verify levels provides a significant improvement to the read level margins with fixed read level. Additionally, changing the read level as function of wordline address before performing read operations may be used to correct residual misalignment from compensation at program time and to account for distribution misalignment between wordlines that develops after program time. Compensation of the read level (or verify level) can be applied on a per-wordline basis or to a group of wordlines within a block. The modification values to either the program verify levels or the read levels may be determined based on experimental data or by simulation data.

Figure 5:
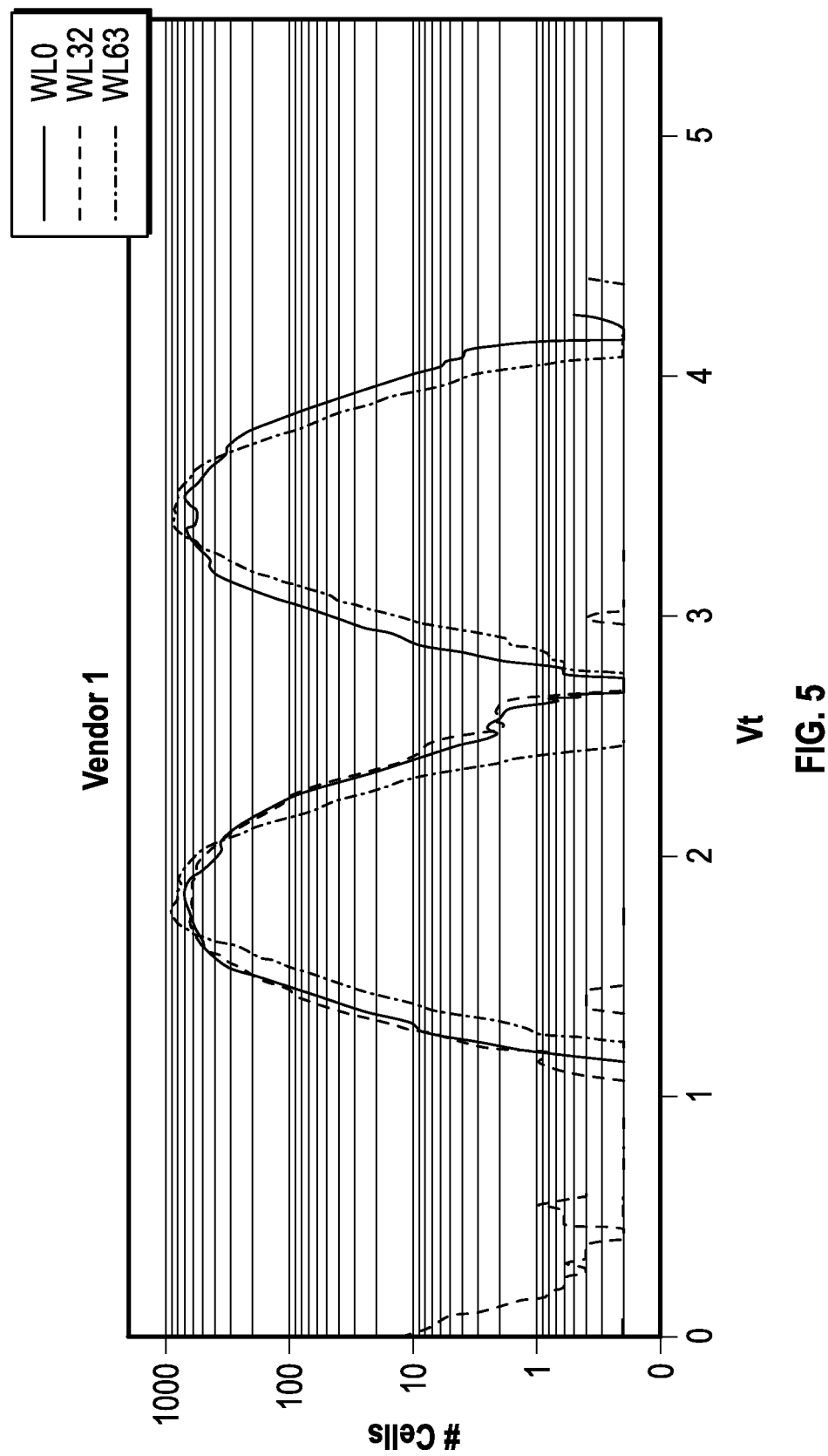
FIG. 5 depicts observed effects of wordline compensation on threshold voltage distributions in an example memory block corresponding to each of six different wordlines along the flash block, with WL0 being the first wordline, WL63 being the last wordline, and others wordlines in between these two.

FIG. 5 depicts observed effects of wordline compensation on threshold voltage distributions in an example memory block corresponding to each of six different wordlines, according to one aspect of the subject technology. As compared to FIG. 3A, the threshold voltage distributions are seen as more aligned with each other and their expected values.

Figure 6:
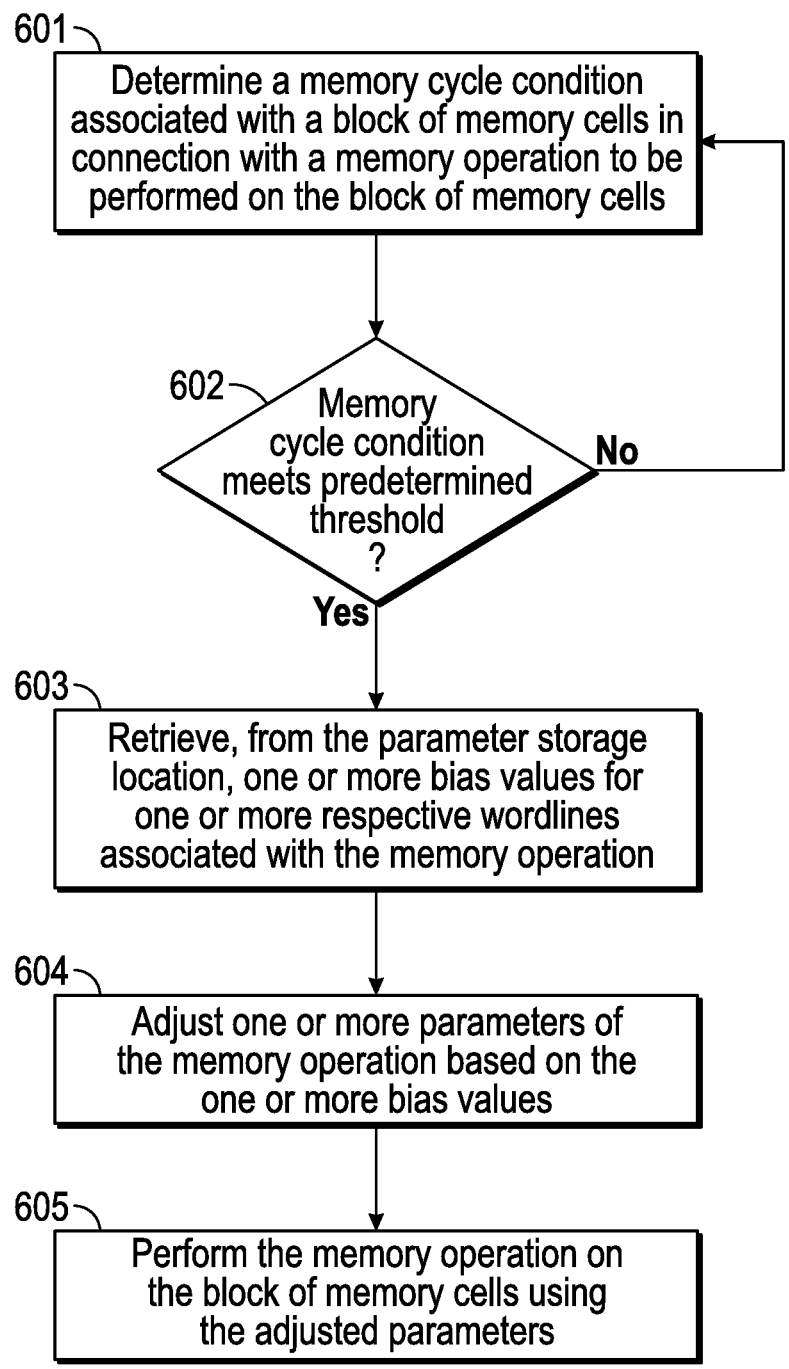
FIG. 6 is a flowchart illustrating an example process for adjusting operating parameters in a storage device.

FIG. 6 is a flowchart illustrating an example process for adjusting operating parameters in a storage device, according to one aspect of the subject technology. According to some aspects, one or more blocks of FIG. 6 may be executed by a solid state storage device, including, for example, a data storage controller. Similarly, a non-transitory machine-readable medium associated with the data storage controller may include machine-executable instructions thereon that, when executed by a computer or machine, perform the blocks of FIG. 6. This wordline programming compensation may result in a reduced number of bits in error compared to not using the compensation technique.

In block 601, a memory cycle condition associated with a block of memory cells is determined in connection with a memory operation to be performed on the block of memory cells. For example, the memory cycle condition may be a current number of program/erase cycles. The data storage controller may store information about each block, including the number of program/erase cycles already performed on a block. The data storage controller may then check the stored information prior to performing the memory operation (e.g., prior to performing a program or read operation on the block). In another example, the memory cycle condition may be a data retention time associated with the block of memory cells.

In block 602, the memory cycle condition is checked to determine whether it satisfies a predetermined threshold. The memory cycle condition may include, for example, a current number of program/erase cycles associated with the block of memory cells, and the predetermined threshold may include a predetermined number of program/erase cycles, or range of cycles. If the memory cycle condition does not satisfy the predetermined threshold (e.g., the current number of program/erase cycles for the block are not within a predetermined range of cycles) then the process returns to block 601 for the next operation.

On the memory cycle condition satisfying the predetermined threshold (e.g., the current number of program/erase cycles for the block is within a predetermined range or greater than a predetermined number of cycles), in block 603, the storage device retrieves, from the parameter storage location, one or more stored bias values for the memory operation based on one or more wordlines associated with the memory operation. In this regard, a data storage controller associated with the storage device may be in the process of undertaking a programming or reading of cells at one or more memory addresses. Accordingly, the one or more wordlines will be wordlines corresponding to the memory addresses.

The one or more stored bias values offset a current shift in cell program levels associated with the one or more wordlines, and, when applied to the memory operation, restore the cell program levels to within a predetermine tolerance of a predetermined value for the current memory cycle condition. In this regard, the predetermined value for the current memory cycle condition may include a minimum or maximum cell program level based on predetermined programming levels for a distribution of cell program levels.

In block 604, one or more parameters of the memory operation are adjusted based on the one or more stored bias values. If the memory operation is a read operation then the one or more parameters may include a read level. If the memory operation is a program operation then the one or more parameters may include a program verify level. As described previously, the data storage controller may be configured to program the flash memory (e.g., via one or more registers of the flash memory) with a program verify level to use for a certain range of memory cycle conditions (e.g., a range of program/erase cycles), and/or adjust the program verify level of the flash memory on a current memory cycle condition satisfying a predetermined threshold (e.g., greater than a number of cycles, or within a new cycle range). After the one or more parameters are adjusted, in block 605, the memory operation is performed on the block of memory cells using the adjusted parameters.

As described previously with respect to the characterization procedure of FIG. 4, only a selected number of blocks may have been characterized to generate bias values. In some aspects, the previously generated bias values may be sufficient for all blocks in a flash memory or for all flash memory in a solid state drive. The lookup table may be configured to store a bias value to be used with all memory blocks, or may store bias values for each block of memory. The lookup table may, for example, include a storage location for each block of memory (e.g., whether or not that block was previously characterized), which is preloaded with an identical bias values that were determined as part of the characterization.

The data storage controller may be configured to dynamically adjust bias values for use in the blocks as it learns new information about the blocks during cycling of the flash memory. In this regard, as flash memory blocks (e.g., of a solid state drive) are cycled, the data storage controller may periodically compare (e.g., every 1 k cycles) current program level distributions for wordlines with stored data (e.g., expected values based on predetermined programming levels), and update the lookup table with new bias values for a respective memory block. For example, if after a certain number of cycles cell level distributions for a wordline are not determined to be shifting as anticipated by previous results (or shifting too much), the currently stored bias values may no longer be appropriate. Accordingly, the data storage controller may reset the currently stored bias to a default value (e.g., zero) or adjust the bias value based on the currently determined shift in cell levels. In some aspects, a shift in a distribution of program levels may be determined based on a bit error rate produced by a read operation.

Current program level distributions for a wordline may be determined from a current error rate for one or more cells associated with the wordline. In this regard, comparing the distributions may include comparing the current error rate with a stored error rate for the wordline and current memory cycle condition. A delta error rate representative of the difference between the current error rate with a stored error rate may be determined, and the bias values dynamically adjusted based on the delta error rate (or difference). In some aspects, the stored bias values may be modified when the difference satisfies a predetermined threshold (e.g., is greater than a predetermine tolerance of a predetermined value for the current memory cycle condition). Additionally or in the alternative, if the current error rate is greater than the stored error rate then the one or more stored bias values may be increased, while if the current error rate is lower than the stored error rate then the one or more stored bias values may be set to a predetermined value, or reduced.

Figure 7:
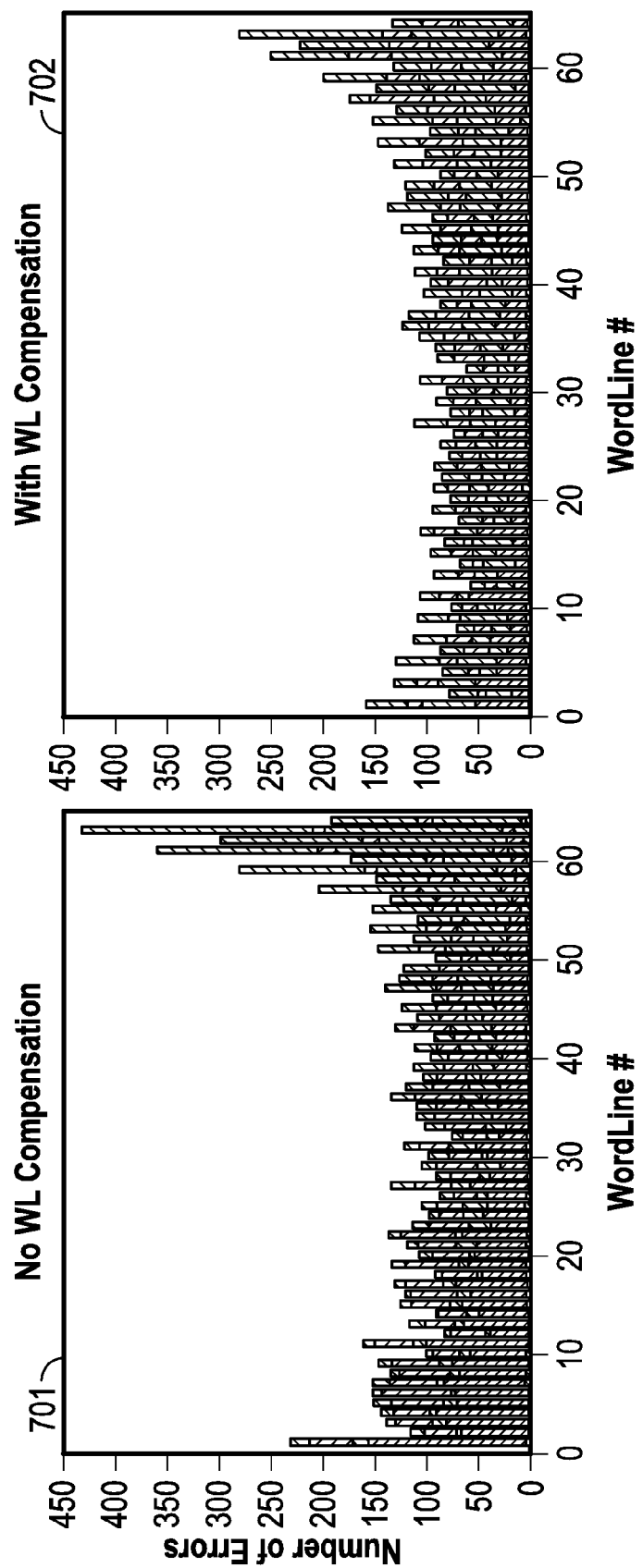
FIG. 7 depicts an example reduction in a number of errors for cells that have been subject to wordline compensation measured on real MLC flash

FIG. 7 depicts an example reduction in a number of errors for cells that have been subject to wordline compensation, according to one aspect of the subject technology. The left side 701 of FIG. 7 depicts a number of errors for each wordline in an example implementation where no compensation method has been employed. The right side 702 of FIG. 7 depicts a number of errors observed for the same wordline using an example implementation of the wordline compensation of the subject technology. As depicted by FIG. 7, threshold voltage distribution may change with both wordline address (number) and program/erase cycle. Accordingly, a default number of errors and a reduced number of errors for each wordline can be determined as a result of the characterization process of the subject technology, and used during runtime operations to determine whether currently stored bias values are effective.

For example, if a higher error rate is determined for a wordline then the data storage controller may determine that the error rate is due to a greater than anticipated shift in a corresponding distribution of program levels for the wordline. A bias value for the wordline may then be increased or set to a predetermined value for the error rate. On the other hand, if a lower than expected error rate is determined then the data storage controller may reset the currently stored bias to a default value. Further improvements to distribution alignment can be obtained by using different threshold voltage compensation values at different endurance levels.

Figure 8:
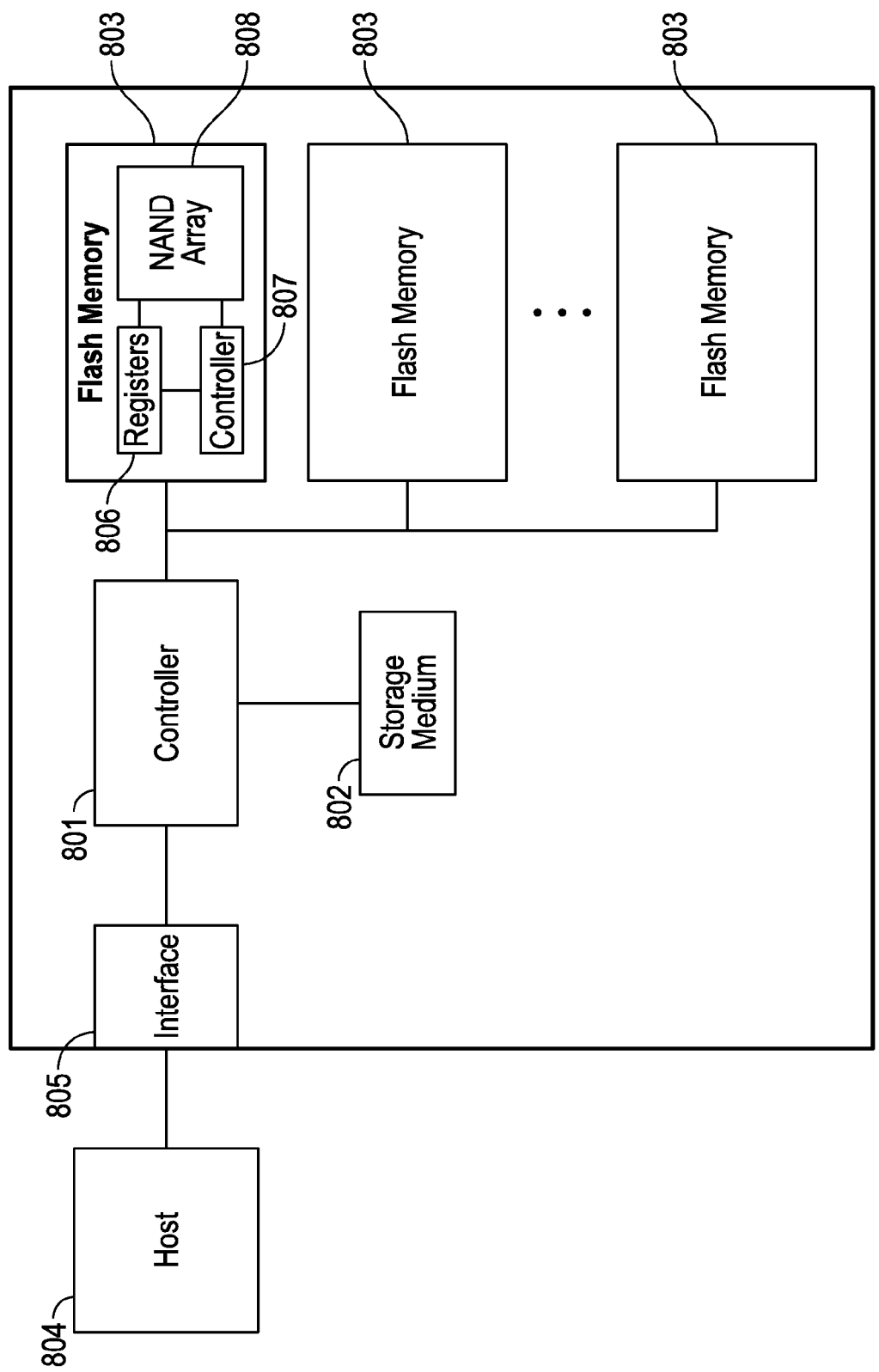
FIG. 8 is a block diagram illustrating components of an example data storage system.

FIG. 8 is a block diagram illustrating components of an example data storage system, according to one aspect of the subject technology. As depicted in FIG. 8, in some aspects, data storage system 800 (e.g., a solid state drive) includes data storage controller 801, storage medium 802, and flash memory 803. Controller 801 may use storage medium 802 for temporary storage of data and information used to manage data storage system 800. Controller 801 may include several internal components (not shown) such as a read-only memory, a flash component interface (e.g., a multiplexer to manage instruction and data transport along a serial connection to flash memory 803), an I/O interface, error correction circuitry, and the like. In some aspects, all of these elements of controller 801 may be integrated into a single chip. In other aspects, these elements may be separated on their own PC board.

In some implementations, aspects of the subject disclosure may be implemented in data storage system 800. For example, aspects of the subject disclosure may be integrated with the function of data storage controller 801 or may be implemented as separate components for use in conjunction with data storage controller 801.

Controller 801 may also include a processor that may be configured to execute code or instructions to perform the operations and functionality described herein, manage request flow and address mappings, and to perform calculations and generate commands. The processor of controller 801 may be configured to monitor and/or control the operation of the components in data storage controller 801. The processor may be a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. One or more sequences of instructions may be stored as firmware on ROM within controller 801 and/or its processor. One or more sequences of instructions may be software stored and read from storage medium 802, flash memory 803, or received from host device 804 (e.g., via host interface 805). ROM, storage medium 802, flash memory 803, represent examples of machine or computer readable media on which instructions/code executable by controller 801 and/or its processor may be stored. Machine or computer readable media may generally refer to any medium or media used to provide instructions to controller 801 and/or its processor, including volatile media, such as dynamic memory used for storage media 802 or for buffers within controller 801, and non-volatile media, such as electronic media, optical media, and magnetic media.

In some aspects, controller 801 may be configured to store data received from a host device 804 in flash memory 803 in response to a write command from host device 804. Controller 801 is further configured to read data stored in flash memory 803 and to transfer the read data to host device 804 in response to a read command from host device 804. As will be described in more detail below, controller 801 is also configured to predict when current read levels and/or settings are suspect and to estimate new read levels when it is predicted that the current read levels and/or settings need to be changed. If the estimated read levels are proven to be insufficient, controller 801 may be configured to perform further iterative adjustments to correct the read level parameters. By dynamically adjusting read levels of the memory 803, the subject technology may extend the number of program/erase operations that may be performed on memory cells within flash memory 803 in a particular application environment, and increase the endurance of the memory cells compared to the same application environment operating without the ability to dynamically adjust read levels.

Host device 804 represents any device configured to be coupled to data storage system 800 and to store data in data storage system 800. Host device 804 may be a computing system such as a personal computer, a server, a workstation, a laptop computer, PDA, smart phone, and the like. Alternatively, host device 804 may be an electronic device such as a digital camera, a digital audio player, a digital video recorder, and the like.

In some aspects, storage medium 802 represents volatile memory used to temporarily store data and information used to manage data storage system 800. According to one aspect of the subject technology, storage medium 802 is random access memory (RAM) such as double data rate (DDR) RAM. Other types of RAM also may be used to implement storage medium 802. Memory 802 may be implemented using a single RAM module or multiple RAM modules. While storage medium 802 is depicted as being distinct from controller 801, those skilled in the art will recognize that storage medium 802 may be incorporated into controller 801 without departing from the scope of the subject technology. Alternatively, storage medium 802 may be a non-volatile memory such as a magnetic disk, flash memory, peripheral SSD, and the like.

As further depicted in FIG. 1, data storage system 800 may also include host interface 805. Host interface 805 may be configured to be operably coupled (e.g., by wired or wireless connection) to host device 804, to receive data from host device 804 and to send data to host device 804. Host interface 805 may include electrical and physical connections, or a wireless connection, for operably coupling host device 804 to controller 801 (e.g., via the I/O interface of controller 801). Host interface 805 may be configured to communicate data, addresses, and control signals between host device 804 and controller 801. Alternatively, the I/O interface of controller 801 may include and/or be combined with host interface 805. Host interface 805 may be configured to implement a standard interface, such as Serial-Attached SCSI (SAS), Fiber Channel interface, PCI Express (PCIe), SATA, USB, and the like. Host interface 805 may be configured to implement only one interface. Alternatively, host interface 805 (and/or the I/O interface of controller 801) may be configured to implement multiple interfaces, which may be individually selectable using a configuration parameter selected by a user or programmed at the time of assembly. Host interface 805 may include one or more buffers for buffering transmissions between host device 804 and controller 801.

Flash memory 803 represents a non-volatile memory device for storing data. According to one aspect of the subject technology, flash memory 803 includes, for example, a NAND flash memory. Flash memory 803 may include a single flash memory device or chip, or, as depicted by FIG. 1, may include multiple flash memory devices or chips arranged in multiple channels. Flash memory 803 is not limited to any particular capacity or configuration. For example, the number of physical blocks, the number of physical pages per physical block, the number of sectors per physical page, and the size of the sectors may vary within the scope of the subject technology.

Flash memory may have a standard interface specification so that chips from multiple manufacturers can be used interchangeably (at least to a large degree). The interface hides the inner working of the flash and returns only internally detected bit values for data. In one aspect, the interface of flash memory 803 is used to access one or more internal registers 806 and an internal flash controller 807 for communication by external devices. In some aspects, registers 806 may include address, command, and/or data registers, which internally retrieve and output the necessary data to and from a NAND memory cell array 808. For example, a data register may include data to be stored in memory array 808, or data after a fetch from memory array 808, and may also be used for temporary data storage and/or act like a buffer. An address register may store the memory address from which data will be fetched to host 804 or the address to which data will be sent and stored. In some aspects, a command register is included to control parity, interrupt control, and the like. In some aspects, internal flash controller 807 is accessible via a control register to control the general behavior of flash memory 803. Internal flash controller 807 and/or the control register may control the number of stop bits, word length, receiver clock source, and may also control switching the addressing mode, paging control, coprocessor control, and the like.

In some aspects, registers 806 may also include a test register. The test register may be accessed by specific addresses and/or data combinations provided at the interface of flash memory 803 (e.g., by specialized software provided by the manufacturer to perform various tests on the internal components of the flash memory). In further aspects, the test register may be used to access and/or modify other internal registers, for example the command and/or control registers. In some aspects, test modes accessible via the test register may be used to input or modify certain programming conditions of flash memory 803 (e.g., read levels) to dynamically vary how data is read from the memory cells of memory arrays 808.

It should be understood that in all cases data may not always be the result of a command received from host 804 and/or returned to host 804. In some aspects, Controller 801 may be configured to execute a read operation independent of host 804 (e.g., to verify read levels or BER). The predicate words "configured to", "operable to", and "programmed to" as used herein do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject technology.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have." or the like is used in the description or the claims, such term is intended to be inclusive in a manner similar to the term "comprise" as "comprise" is interpreted when employed as a transitional word in a claim.

What is claimed is:

1. A method for setting operating parameters in a storage device, comprising:
   identifying, in connection with a memory operation, one or more wordlines associated with a plurality of flash memory cells;
   determining that a current memory cycle condition associated with the plurality of flash memory cells satisfies a predetermined cycle condition;
   setting one or more parameters of the memory operation based on one or more selected bias values, the bias values being selected based on the identified one or more wordlines and the current memory cycle condition satisfying the predetermined cycle condition; and performing the memory operation using the set one or more parameters.

2. The method of claim 1, wherein the current memory cycle condition is a current number of program/erase cycles, and wherein the predetermined cycle condition is a predetermined number of program/erase cycles.

3. The method of claim 2, further comprising:
retrieving the one or more bias values from a stored location based on an indexing of a lookup table by one or more wordline addresses associated with the identified one or more wordlines and the current number of program/erase cycles.

4. The method of claim 3, wherein the memory operation is a program operation and the one or more parameters comprise a program verify level.

5. The method of claim 3, wherein the memory operation is a read operation and the one or more parameters comprise a read level.

6. The method of claim 3, further comprising:
determining one or more current program level distributions for data stored in the plurality of flash memory cells; and
updating the one or more bias values in the stored location based on a difference between the determined one or more current program level distributions and predetermined expected values for predetermined programming levels for the current number of program/erase cycles.

7. The method of claim 1, further comprising:
determining an error rate for the plurality of memory cells;
adjusting the one or more bias values based on a difference between the determined error rate and a predetermined error rate, the predetermined error rate being predetermined for the current memory cycle condition and the one or more wordlines.

8. The method of claim 7, wherein the one or more bias values are increased if the determined error rate is greater than the predetermined error rate.

9. The method of claim 7, wherein the one or more bias values are set to a default value if the determined error rate is lower than the predetermined error rate.

10. The method of claim 1, wherein the current memory cycle condition is a current retention time associated with the plurality of memory cells, and wherein the predetermined cycle condition is a predetermined retention time.

11. The method of claim 1, wherein setting one or more parameters of the memory operation comprises setting a first parameter for performing the memory operation on a first wordline of the one or more wordlines based on a first bias value, and setting a second parameter for performing the memory operation on a second wordline of the one or more wordlines based on a second bias value, the first and second bias values having different values.

12. A system, comprising:
one or more processors;
one or more flash memory; and
one or more memory media having bias values stored thereon, the one or more memory media having instructions stored thereon that, when executed by the one or more processors, cause the one or more processors to:
identify, in connection with a memory operation, one or more wordlines associated with a plurality of memory cells of the one or more flash memory;
determine that a current memory cycle condition associated with the plurality of memory cells satisfies a predetermined cycle condition;
set one or more parameters of the memory operation based on one or more selected bias values, the bias values being selected based on the identified one or more wordlines and the current memory cycle condition satisfying the predetermined cycle condition; and
perform the memory operation using the set one or more parameters.

13. The system of claim 12, wherein the current memory cycle condition is a current number of program/erase cycles, and wherein the predetermined cycle condition is a predetermined number of program/erase cycles.

14. The method of claim 13, wherein the instructions, when executed, further cause the one or more processors to:
retrieve the one or more bias values from a stored location based on an indexing of a lookup table by one or more wordline addresses associated with the identified one or more wordlines and the current number of program/erase cycles.

15. The system of claim 14, wherein the memory operation is a program operation and the one or more parameters comprise a program verify level.

16. The system of claim 14, wherein the memory operation is a read operation and the one or more parameters comprise a read level.

17. The system of claim 14, wherein the instructions, when executed, further cause the one or more processors to:
determine an error rate for the plurality of memory cells;
adjust the one or more bias values based on a difference between the determined error rate and a predetermined error rate, the predetermined error rate being predetermined for the current memory cycle condition and the one or more wordlines.

18. The system of claim 12, wherein the current memory cycle condition is a current retention time associated with the plurality of memory cells, and wherein the predetermined cycle condition is a predetermined retention time.

19. The system of claim 12, wherein setting one or more parameters of the memory operation comprises setting a first parameter for performing the memory operation on a first wordline of the one or more wordlines based on a first bias value, and setting a second parameter for performing the memory operation on a second wordline of the one or more wordlines based on a second bias value, the first and second bias values having different values.

20. A machine-readable medium including machine-executable instructions thereon that, when executed by a computer or machine, perform a method, comprising:
identifying, in connection with a flash memory operation, one or more wordlines associated with a plurality of flash memory cells;
determining that a current memory cycle condition associated with the plurality of flash memory cells satisfies a predetermined cycle condition;
setting one or more parameters of the memory operation based on one or more selected bias values, the bias values being selected based on the identified one or more wordlines and the current memory cycle condition satisfying the predetermined cycle condition; and
performing the memory operation using the set one or more parameters.

\* \* \* \* \*